United States Patent
Gray

(12) 
(10) Patent No.: US 6,484,271 B1
(45) Date of Patent: Nov. 19, 2002

(54) MEMORY REDUNDANCY TECHNIQUES

(75) Inventor: Kenneth S. Gray, Jericho, VT (US)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 09/397,576

(22) Filed: Sep. 16, 1999

(51) Int. Cl.[7] ............................................... H02H 3/05

(52) U.S. Cl. ............................................... 714/6; 714/5
(58) Field of Search ................................ 714/6, 7, 8, 5; 365/200

(56) References Cited

U.S. PATENT DOCUMENTS

| | | | |
|---|---|---|---|
| 3,633,175 A | 1/1972 | Harper | 340/172.5 |
| 4,047,163 A | 9/1977 | Choate et al. | 340/173 |
| 4,051,354 A | 9/1977 | Choate | 235/312 |
| 4,376,300 A | * 3/1983 | Tsang | 365/200 |
| 4,398,248 A | 8/1983 | Hsia et al. | 364/200 |
| 4,475,194 A | 10/1984 | La Vallee et al. | 371/10 |
| 5,031,142 A | 7/1991 | Castro | 365/49 |
| 5,046,046 A | 9/1991 | Sweha et al. | 365/200 |
| 5,084,838 A | 1/1992 | Kajimoto et al. | 365/63 |
| 5,179,536 A | 1/1993 | Kasa et al. | 365/200 |
| 5,208,782 A | 5/1993 | Sakuta et al. | 365/230.03 |
| 5,438,546 A | 8/1995 | Ishac et al. | 365/200 |
| 5,524,231 A | 6/1996 | Brown | 395/428 |
| 5,579,265 A | 11/1996 | Devin | 365/200 |
| 5,604,702 A | 2/1997 | Tailliet | 365/200 |
| 5,644,541 A | 7/1997 | Siu et al. | 365/200 |
| 5,677,880 A | 10/1997 | Horiguchi et al. | 365/200 |
| 5,751,647 A | 5/1998 | O'Toole | 365/200 |
| 5,758,056 A | 5/1998 | Barr | 395/182.05 |
| 5,764,878 A | 6/1998 | Kablanian et al. | 395/182.05 |
| 5,784,321 A | 7/1998 | Yamamura | 365/200 |

(List continued on next page.)

FOREIGN PATENT DOCUMENTS

EP  0 911 747 A1  4/1999  ........... G06F/17/50

OTHER PUBLICATIONS

Hiroki Koike et al, "A 30ns 64MB Dram with Built–inSelf-–Test and Repair Function", IEEE International Solid State Circuits Conference, vol. 35, Feb. 1992.

Takeda E et al, "VLSI Reliability Challenges; From Device Physics to Wafer Scale Systems", Proceedings of the IEEE, vol. 81, No. 1, May 1993.

*Primary Examiner*—Robert Beausoleil
*Assistant Examiner*—Yolanda L. Wilson
(74) *Attorney, Agent, or Firm*—Peter Zawilski

(57) ABSTRACT

A redundant memory system includes an address bus, a random access memory, a content addressable memory, a replacement memory, and a data bus. The random access memory includes a number of addressable memory locations each accessed by a different one of a number of addresses provided by the address bus. The content addressable memory stores a number of defective location addresses each corresponding to a defective addressable memory location of the random access memory and responds to a match between an address provided by the address bus and one of the defective location addresses to activate one of a number of match lines. The replacement memory is coupled to the content addressable memory by the match lines and includes a number of replacement memory locations each accessed by activating a different one of the lines. The data bus receives addressable memory information from the random access memory when addressed by one of the addresses other than one of the defective location addresses and receives replacement information from the replacement memory in response to activate a respective match line. Defective information in the addressable memory is accessed in response to addressing by one of the defective location addresses, but output of the defective information is prevented during a read operation by the match line activation.

28 Claims, 6 Drawing Sheets

U.S. PATENT DOCUMENTS

| | | |
|---|---|---|
| 5,787,043 A | 7/1998 | Akioka et al. ............... 365/200 |
| 5,793,683 A | 8/1998 | Evans ........................ 365/200 |
| 5,808,946 A | 9/1998 | Roohparvar ................. 365/200 |
| 5,831,913 A | 11/1998 | Kirihata ...................... 365/200 |
| 5,831,914 A | 11/1998 | Kirihata ...................... 365/200 |
| 5,841,711 A | 11/1998 | Watanabe ................... 365/200 |
| 5,841,712 A | 11/1998 | Wendell et al. ............. 365/200 |
| 5,841,961 A | 11/1998 | Kozaru et al. ......... 395/182.03 |
| 5,862,086 A | 1/1999 | Makimura et al. .......... 365/200 |
| 5,881,003 A | 3/1999 | Kirihata et al. ............. 365/200 |
| 6,286,116 B1 * | 9/2001 | Bhavsar ...................... 714/720 |

* cited by examiner

MEMORY REDUNDANCY TECHNIQUES

BACKGROUND OF THE INVENTION

The present invention relates to memory devices, and more particularly, but not exclusively, relates to redundant memory systems.

Redundant memory is sometimes used to improve fault tolerance of data storage subsystems. In the case of embedded memory for Integrated Circuits (ICs), redundancy is frequently used to improve manufacturing yield. For Application Specific Integrated Circuits (ASICs), a Hardware Development Language (HDL) macro typically specifies embedded memory. Both primary and redundant memory circuits are often integrally defined by such macros. Consequently, embedded memory macros for ASICs are generally rather complex. Moreover, modifying either the redundant memory scheme or primary memory scheme of these ISE macros may inadvertently impact the scheme not intended to be changed. As an example, it often proves difficult to adjust the amount of redundant memory relative to the amount of primary memory for this type of macro—sometimes introducing race conditions and other problems associated with modifying a complex digital design.

Thus, there is a demand for advancements in the memory redundancy technology. Such advancements may be applied not only to macro-defined embedded memory of a single IC, but also to multi-chip and multi-component systems.

SUMMARY OF THE INVENTION

One form of the present invention is a unique memory device. Another form includes unique redundant memory systems and methods.

A further form is a unique redundant memory macro for defining ICs. This redundant memory macro may be utilized in conjunction with primary memory macros to define an embedded memory with a selectable degree of redundancy.

In another form, a Built-In Self Test (BIST) is implemented with a redundant memory to accommodate yield failures of an associated primary memory. The BIST, redundant memory, and primary memory may be embedded on a common, integrated circuit chip or defined by two or more separate components or integrated circuits.

Still another form includes one or more primary memories associated with a redundant memory. The redundant memory includes a content addressable memory coupled to a replacement memory. Also included is a unique arrangement for providing replacement memory contents in lieu of corresponding primary memory contents that have been determined to be defective.

Further forms, embodiments, aspects, features, and objects of the present invention will become apparent from the description and drawings contained herein.

DESCRIPTION OF THE PREFERRED EMBODIMENTS

Figure 1:
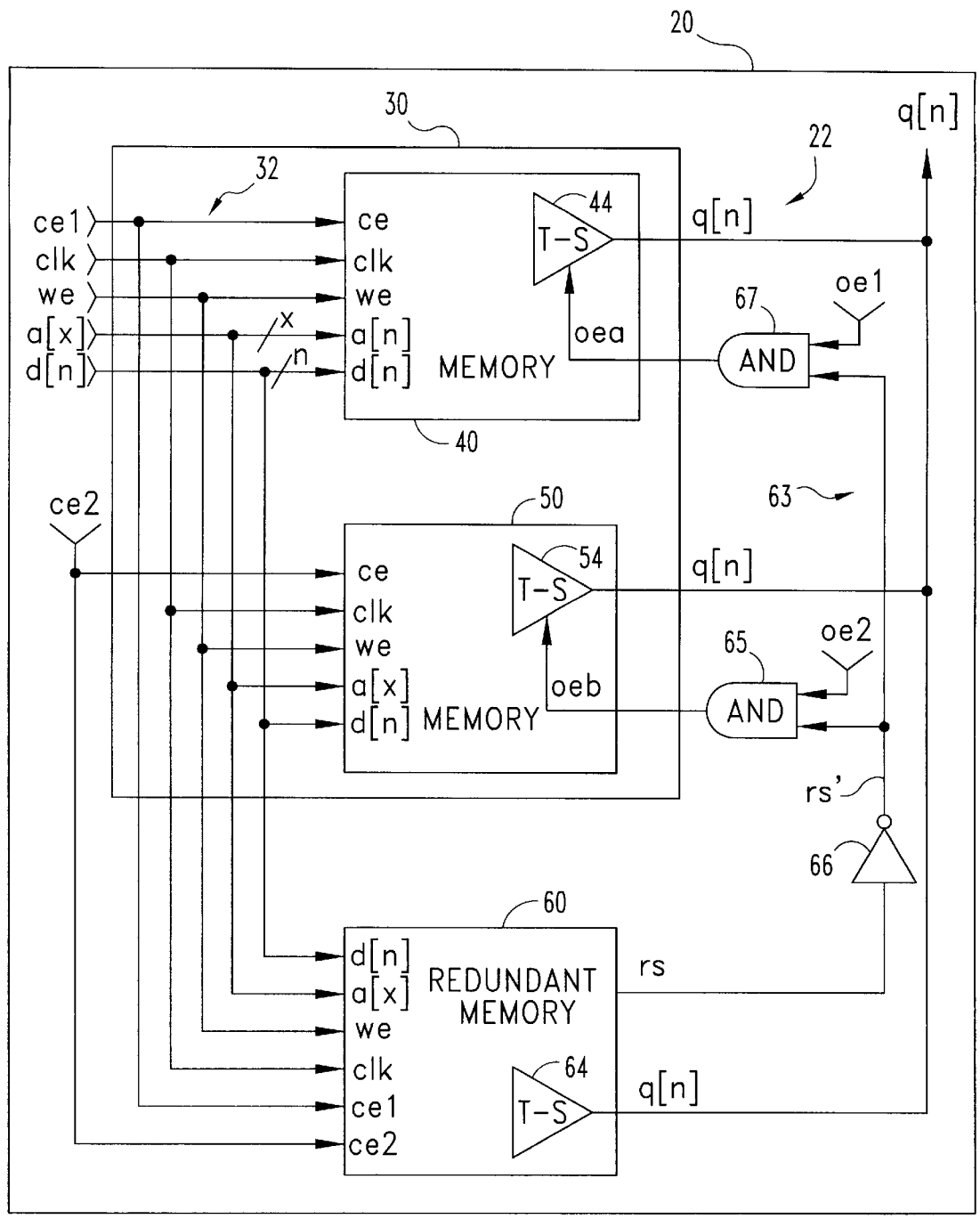
FIG. 1 is a schematic view of an integrated circuit of one embodiment of the present invention.

For the purpose of promoting an understanding of the principles of the invention, reference will now be made to the embodiments illustrated in the drawings and specific language will be used to describe the same. It will nevertheless be understood that no limitation of the scope of the invention is thereby intended. Any alterations and further modifications in the described embodiments, and any further applications of the principles of the invention as described herein are contemplated as would normally occur to one skilled in the art to which the invention relates.

FIG. 1 schematically depicts integrated circuit (IC) 20 of one embodiment of the present invention. In one example, integrated circuit 20 is of the Application Specific Integrated Circuit (ASIC) variety where at least a portion of the circuitry for integrated circuit 20 is defined through a Hardware Development Language (HDL) such as Verilog or VHDL. HDL may be utilized to specify an arrangement of standard logic cell types through one or more macros to define a desired logical structure, such as a memory. As used herein, a "macro" refers to a logical module described in terms of one or more HDL defined cells.

Integrated circuit 20 includes an embedded redundant memory 22 specified through a number of macros. For example, embedded memory 22 includes a primary memory 30 defined by two instances of the same memory macro to provide two logical memory blocks or modules 40 and 50. Each memory module 40, 50 is of the read/write Random Access Memory (RAM) type. Redundant memory module 60 of embedded memory 22 is specified by a different macro from memory modules 40 and 50 that may be separately specified to vary the amount of redundancy for primary memory 30. Further, unique aspects concerning these macros are described in connection with FIG. 6 hereinafter.

Embedded memory 22 defines an input bus 32 coupled to memory modules 40, 50, 60. Bus 32 includes "module enable" signals unique to each memory module 40, 50 of primary memory 30 that are designated as ce1, ce2. The "ce" input of memory module 40 receives ce1 to selectively enable its operation and the "ce" input of memory module 50 receives ce2 to selectively enable its operation. It should be appreciated that "ce" typically designates an "chip enable", but in this instance the designation of modules 40, 50 as part of a common embedded memory 22 for the same integrated circuit 20 should not be understood to refer to separate chips. Under normal operating conditions, at most only one of ce1 or ce2 is active (=1) at a time. Also, redundant memory module 60 receives both ce1 and ce2 as inputs.

The macro-defined memory modules 40, 50, 60 also receive a synchronizing clock input "clk" from bus 32. Furthermore, bus 32 includes a write enable "we" to designate whether a write or read operation is being performed with respect to embedded memory 22. The ce1, ce2, clk, and we inputs typically each correspond to a single binary path of input bus 32 and operate as a single discrete binary signal (single bit). Input bus 32 also includes a parallel address bus a[x]; where "x" represents the width of bus a[x] in terms of bits and a parallel input data bus d[n]; where "n" represents the width of bus d[n] in terms of bits. Bus a[x] and d[n] are also input to each of memory modules 40, 50, 60. Memory modules 40, 50, 60 are each coupled to an output bus 62 via tri-state (T-S) output buffers 44, 54, 64, respectively. Output bus 62 includes parallel output data bus q[n]; where "n" is the same as for input data bus d[n], and likewise specifies bit width.

Redundant memory module 60 selectively generates a memory replacement operation signal "rs" that is coupled to primary memory modules 40, 50 via redundancy operation logic 63 to arbitrate whether primary memory 30 or redundant memory module 60 will output data to bus q[n]. Logic 63 includes two-input AND gates 65, 67 and inverter 66. Inverter 66 inverts the single bit signal rs and supplies the inverted rs signal, designated rs'; "'" where symbolizes the inverted form of the signal descriptor to its immediate left. Signal rs' is provided to one input to each of AND gates 65, 67. The other input to each AND gate 65, 67 is in the form of a different memory output enable signal oe1 or oe2. Signal oe1 corresponds to memory module 40 and signal oe2 corresponds to memory module 50. The output of each AND gate 65, 67 is provided to the output enable inputs oea, oeb of the memory modules 40, 50, respectively. Logic 63 operates in accordance with the following truth table I.

TABLE I

| INPUTS | | | OUTPUTS | |
|---|---|---|---|---|
| rs | oe1 | oe2 | oea | oeb |
| 0 | 0 | 0 | 0 | 0 |
| 0 | 0 | 1 | 0 | 1 |
| 0 | 1 | 0 | 1 | 0 |
| 0 | 1 | 1 | X | X |
| 1 | 0 | 0 | 0 | 0 |
| 1 | 0 | 1 | 0 | 0 |
| 1 | 1 | 0 | 0 | 0 |
| 1 | 1 | 1 | 0 | 0 |

For truth table I, all signals are active high and "X" indicates a "don't care" condition. Accordingly, whenever rs is active high (1), logic 63 prevents oe1 or oe2 from enabling tri-state buffers 44, 54.

Figure 2:
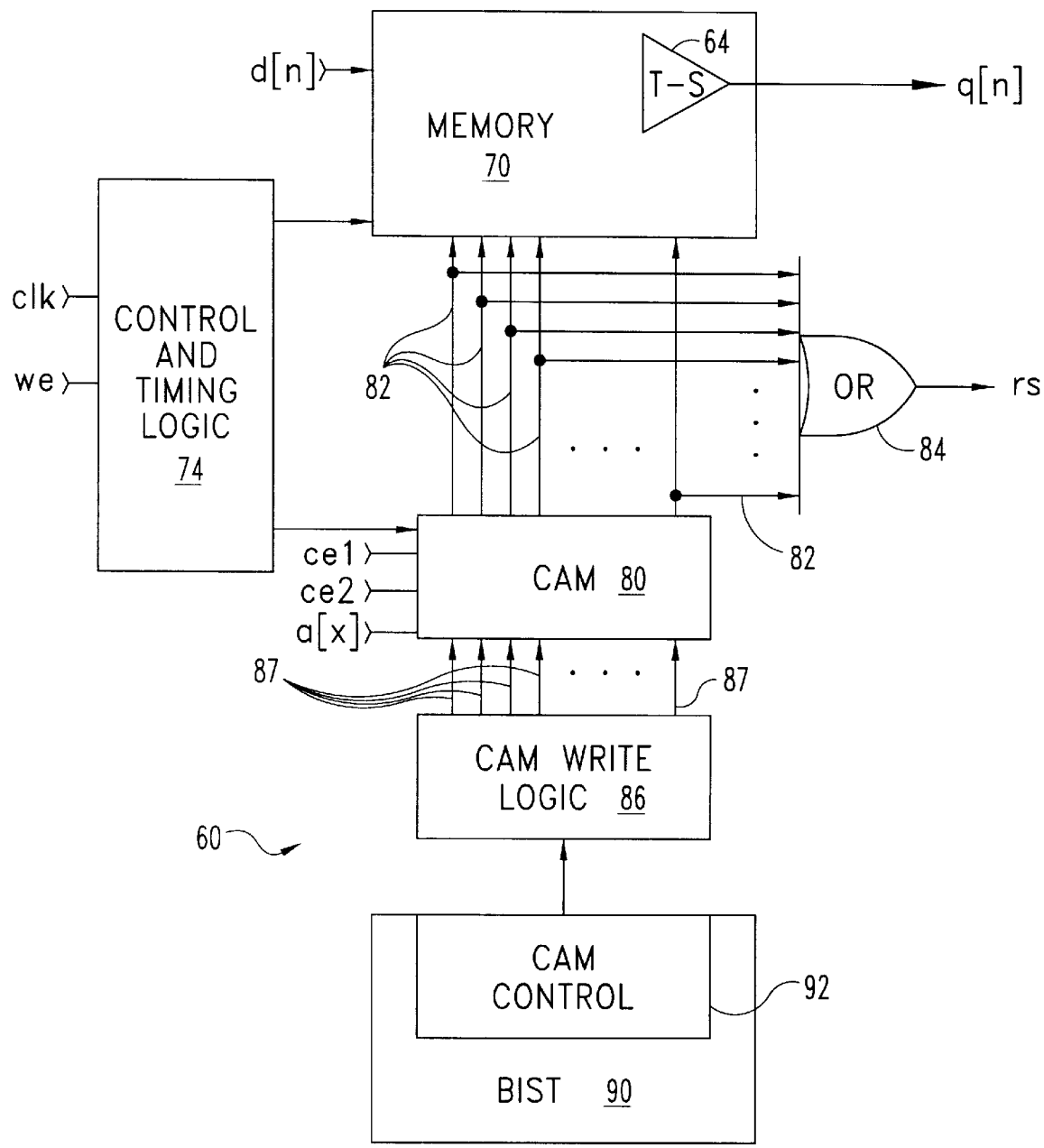
FIG. 2 is a schematic view of the redundancy macro shown in FIG. 1.

Referring additionally to FIG. 2, replacement memory module 60 is further illustrated. Replacement memory module 60 includes a multi-location, read/write replacement memory 70 coupled to data busses d[n] and q[n]. Replacement memory 70 is also coupled to control and timing logic 74 that receives clk and we signals of input bus 32. Memory 70 further includes a number of separately addressable read/write locations that may be individually accessed by activation of a corresponding one of the match signal line paths 82 from content addressable memory (CAM) 80. Only a few of the match line signal paths 82 are specifically designated by reference numerals to preserve clarity. Match line signal paths 82 are also each input to an OR logic gate 84 to generate signal rs. OR gate 84 may be of a distributed variety. CAM 80 receives ce1, ce2 and a[x] as inputs. CAM 80 is arranged to store ce1, ce2, and a[x] inputs that correspond to a defective memory location of primary memory 30. Subsequently, for any match between a memory in CAM 80 and the values on bus a[x] and ce1, ce2; a unique match line signal path 82 is activated. CAM write logic 86 is coupled to CAM 80 by write activation line paths 87 to store ce1, ce2, a[x] values. Logic 86 is controlled by CAM selection control logic portion 92 of Built-In-Self-Test (BIST) logic 90. In FIG. 2, each ellipses represent the optional addition of one or more features like those between which the given ellipsis is situated.

Figure 3:
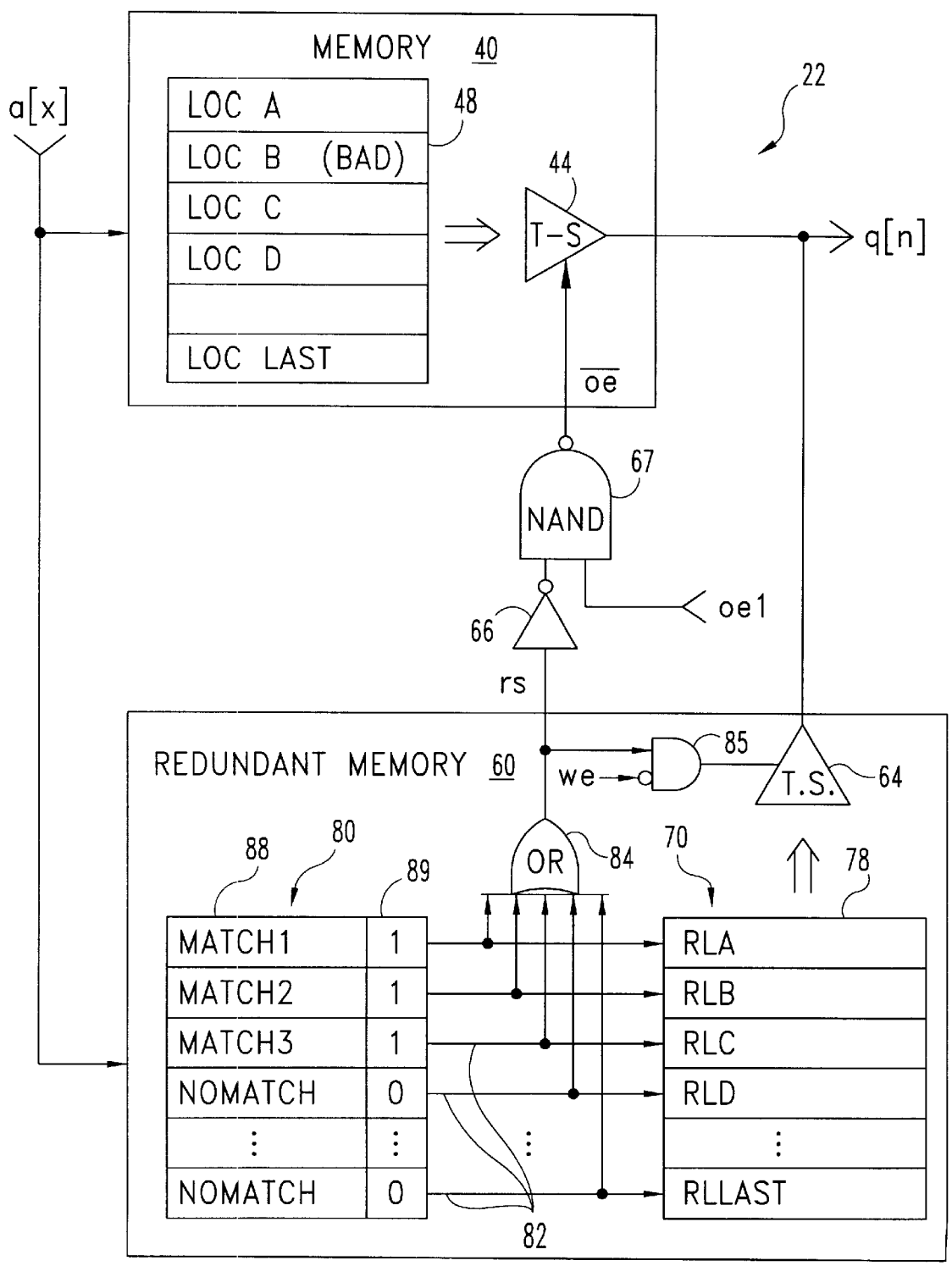
FIG. 3 is a schematic view showing selected aspects of the embodiment of FIG. 1 in greater detail.

Turning also to FIG. 3, further aspects of embedded memory 22 are illustrated, but only memory module 40 of primary memory 30 is shown to preserve clarity, it being understood that memory module 50 is configured in a like manner. In FIG. 3, memory module 40 is shown with a number of read/write, randomly addressable memory locations 48 individually designated as locations LOC A, LOC B, LOC C, . . . , LOC LAST. These locations may be of a single or multi-bit variety. In one example, a macro for specifying memory module 40 and memory module 50 provides 1024 locations for each module with each location having a 32 bit width. Correspondingly, for this nonlimiting example, n=32 and x=10for data busses d[n], q[n], and address bus a[x], respectively. In other examples, a different arrangement may be utilized as would occur to those skilled in the art. In FIG. 3, a hollow arrow represents the input of an accessed one of locations 48 to tri-state output buffer 44 in accordance with the specific address provided by address bus a[x] and activation of ce1. In general, ce1, ce2, and a[x] are operable to collectively define a set of unique values each accessing a different one of the addressable memory locations of primary memory 30.

FIG. 3 also further illustrates replacement memory 70 and CAM 80. Read/write accessible memory locations 78 of replacement memory 70 are illustrated and individually designated as replacement locations RLA, RLB, RLC, RLD, . . . , RLLAST. Also illustrated are a number of locations 88 for CAM 80. Locations 88 designated by MATCH1, MATCH2, MATCH3, each represent a content that matches a different value defined by ce1, ce2, a[x]. These values each designate a different location within primary memory 30. On the other hand, the locations 88 designated by NOMATCH are not intended to correspond to a selected location of primary memory 30 given by ce1, ce2, a[x]. Furthermore, each location 88 includes a flag bit (FB) 89. For a given location 88, flag bit 89 is set (FB=1) to indicate content corresponding to a value defined by ce1, ce2, a[x] that designates one of the primary memory locations, and flag it 89 is not set (FB=0) to indicate that it has not been selected to correspond to a given location of primary memory 30.

For each location 78 and 88, there is a corresponding match line signal path 82 output by CAM 80 and input to replacement memory 70 and OR gate 84. The vertical ellipses of FIG. 3 each represent the optional addition of features of the same type they are situated between. Typically, the quantity of locations 78 and 88 are the same. Furthermore, the number of locations 78 is typically less than the number of locations provided by primary memory 30. Furthermore, the bit width of locations 78 are typically at least as great as the bit width of corresponding locations in primary memory 30.

Referring generally to FIGS. 1–3, operation of embedded memory 22 is next further described, first for a normally operating location of primary memory 30 and then for a defective location of primary memory 30. In the first case, when an address is provided on address bus a[x] with ce1 or ce2 active (=1), the corresponding location of primary memory 30 is accessed. For example, location A (LOC A) of memory module 40 is accessed by an appropriate a[x] address with ce1 active (ce1=1). In another example, a location of memory module 50 corresponding to an a[x] address is accessed when ce2 is active (ce2=1). For any location accessed, a write operation is performed when we=1, and a read operation is performed when we=0. For a write operation (we=1), data is input to primary memory 30 with data input bus d[n]. For a read operation (we=0), data is output to output data bus q[n] through activation of the corresponding tri-state output buffer 44, 54. Buffers 44, 54 are activated by signals oea, oeb, respectively. Signals oea, oeb are each determined as a function of its respective enable signal input oe1 or oe2 and signal rs. Specifically: oea=(oe1*rs') and oeb=(oe2*rs').

In contrast, under the second case, if a location of primary memory 30, such as LOC B of memory module 40 is determined to be defective, then redundant memory module 60 is utilized to provide a replacement read/write memory location 78 from replacement memory 70. During this replacement operation, any output of defective information from an accessed location of primary memory 30 on output data bus q[n] is prevented by logic 63. For the instance where LOC B is defective, its ce1, ce2, a[x] designation (collectively labeled "BAD" for description purposes) is stored in a corresponding location 88 of CAM 80 as a "match" entry, with bit flag 89 set (FB=1), such as the specifically designated location MATCH1 (c(MATCH1)= BAD). Likewise, the other match entries of CAM 80 (MATCH2, MATCH3, etc.) correspond to other defective locations of primary memory 30 and each has bit flag 89 set (FB=1).

Continuing with the LOC B example, when ce1, ce2, a[x]=BAD is placed on bus 32, MATCH1 is compared within CAM 80 and found to be the same. In response, the respective match line signal path 82 becomes active (=1). Each location 78 of replacement memory 70 is uniquely accessed by activation of a different one of the match line signal paths 82. For the described example, RLA is accessed when signal path 82 corresponding to location MATCH1 is activated. If a write operation is specified (we=1), then d[n] is written into RLA with the tri-state output buffers 44, 54, 64 remaining inactive. If a read operation is indicated (we=0), then tri-state output buffer 64 is activated to provide the content of RLA on data bus q[n](q[n]=c(RLA)). The activation of tri-state output buffer 64 is provided by logic gate 85 as shown in FIG. 3. Logic gate 85 is a two-input AND gate with one input inverted. The we signal is provided to the inverted input of gate 85 and rs is provided to the other input, such that the output of gate 85=rs*we'. As a result, tri-state buffer 64 becomes active when rs is active (rs=1) and we is inactive (we=0). The activation of any of the match line signals sets rs high (rs=1) by operation of OR gate 84. Correspondingly, inverter 66 and AND gates 64, 65 of logic 63 prevent activation of tri-state buffers 44, 54 of primary memory 30 when a replacement operation with one of locations 78 of replacement memory 70 is being performed.

The determination of which locations of primary memory 30 are suspect or defective may be done by dedicated testing as part of the initial manufacture of integrated circuit 20, and CAM 80 correspondingly configured using logic 86. Alternatively or additionally, BIST logic 90 may be utilized to write suspect addresses into CAM 80 and correspondingly set flag bits 89 at the time of integrated circuit 20 testing and initial manufacture. Moreover, BIST logic 90 may be arranged to re-test primary memory 30 from time-to-time to dynamically update CAM 80 contents in accordance with any failed/suspect location of primary memory 30 discovered during subsequent use of integrated circuit 20. In one example, BIST 90 is performed on a periodic basis. In another example, BIST 90 is performed upon power-up or in response to a command m while integrated circuit 20 is operating. Likewise, BIST logic 90 may be arranged to determine if a storage location of replacement memory 70 or CAM 80, and/or associated logic have failed; and to reconfigure redundant memory module 60 accordingly during use of integrated circuit 20 in the field.

Many alternative embodiments of the present invention are envisioned. For example, in one alternative, BIST logic is not utilized. Instead, dedicated external testing is used to configure CAM 80 in response to the detection of any defective or suspect locations of primary memory 30. In another embodiment, more or fewer memory modules 40 or 50 are utilized in primary memory 30 using the same or a different memory macro to specify any additional modules. In still another embodiment, primary memory 30 and redundant memory module 60 are not defined by memory macros, but instead are provided by coupling two or more components together to provide a corresponding multi-component memory system. Optionally, or additionally, other embodiments may utilize memories that do not include a tri-state output mechanism.

Figure 4:
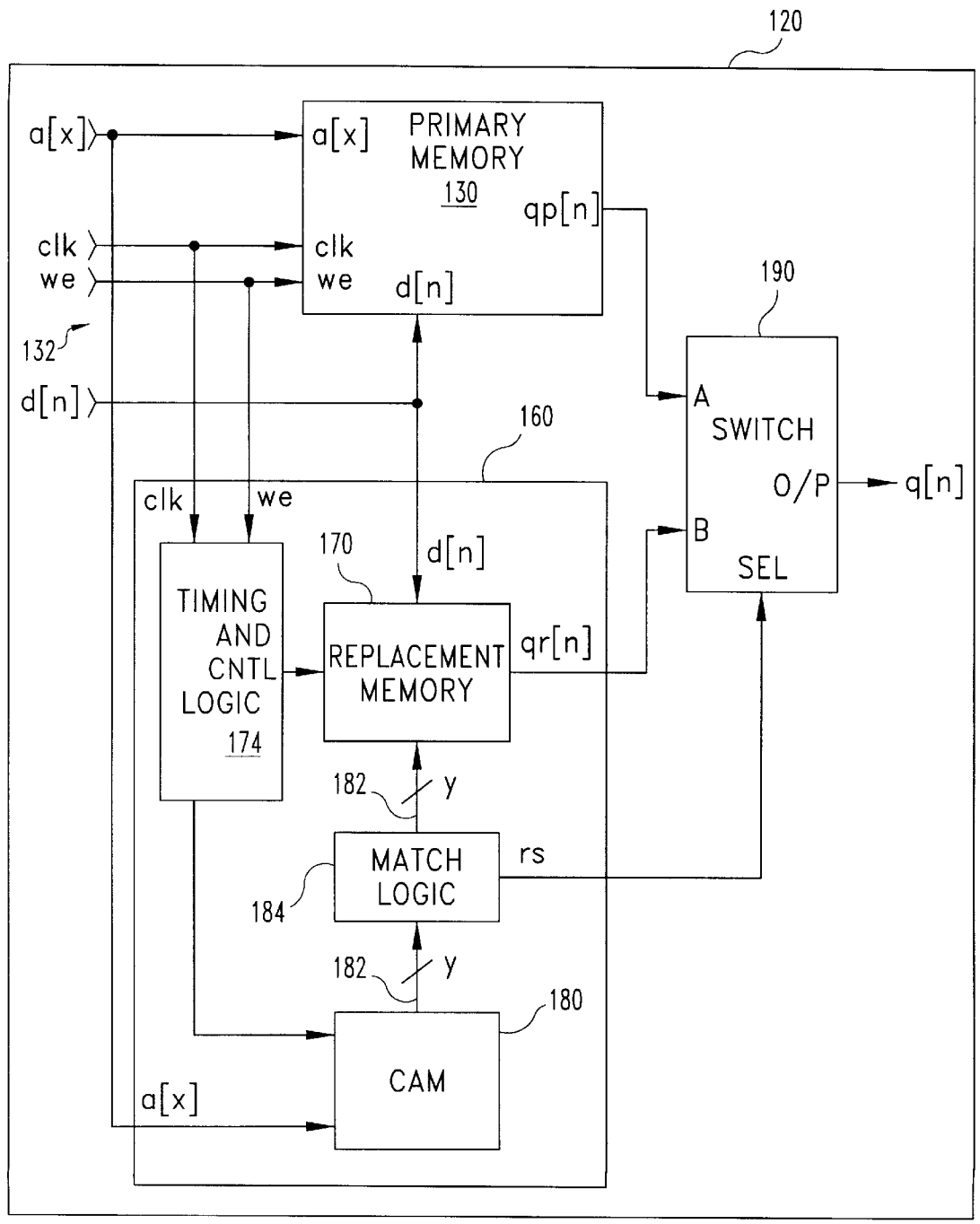
FIG. 4 is a schematic view of an alternative embodiment of a redundant memory system of the present invention.

FIG. 4 illustrates another embodiment of a redundant memory system 120 of the present invention that utilizes a different output selection technique. System 120 may be a collection of two or more components or embedded on a single integrated circuit. System 120 includes primary memory 130 coupled to input bus 132. Primary memory 130 may be defined by one or more macros, components, or integrated circuit chips as would occur to those skilled in the art. Input bus 132 includes clk and we inputs as previously described for embedded memory 22. Input bus 132 also includes address bus a[x] and data input bus d[n] configured as described for the commonly designated busses of embedded memory 22. Because only a single memory module is shown for primary memory 130, no explicit enable input such as the "ce" inputs for primary memory 30 are shown. Nonetheless, it should be appreciated that primary memory 30 may be comprised of two or more modules, chips, or macros each activated separately from the others in accordance with individual ce or other enable inputs. Such enable inputs may be specified as part of an address presented on address bus a[x], as separate signals as in the case of embedded memory 22, or as would otherwise occur to those skilled in the art.

System 120 also includes redundant memory circuit 160 coupled to input bus 132. Redundant memory circuit 160 may be defined by one or more components, macros, or integrated circuits; or may be integrally defined on a common ASIC along with primary memory 30. Generally, redundant memory circuit 160 is configured as described for redundant memory module 60 of embedded memory 22, except for the output selection technique associated with output data bus q[n]. Redundant memory circuit 160 includes read/write replacement memory 170 to selectively substitute its contents for defective or suspect locations of primary memory 130. Replacement memory circuit 160 also includes clock and control logic 174 to synchronize and direct operation like logic 74 of embedded memory 22. CAM memory 180 is further included that stores addresses corresponding to defective or suspect locations of primary memory 130 to facilitate substitution with replacement memory 170. CAM 180 compares each address presented on address bus a[x] to each of its entries to determine if a match exists. If so, a corresponding location of replacement memory 170 is accessed in lieu of the defective location of primary memory 130. This substitution is initiated by activation of a corresponding one of "y" number of match line signal paths 182 by CAM 180 to access a respective location of replacement memory 170. The match line signal paths 182 are also input to match logic 184 to generate signal rs. Logic 184 is operable to set signal rs (rs=1), when contents of a location of CAM 180 matches an address presented on address bus a[x].

Primary memory 130 and replacement memory 170 each have an intermediate parallel data bus qp[n], qr[n], respectively, that is input into data source selection switch 190. Specifically, data bus qp[n] from primary memory 130 is provided to input A of switch 190 and data bus qr[n] of replacement memory 170 is provided to input B of switch 190. Either input A or input B is routed to the output O/P of switch 190 in accordance with input selection signal SEL. Selection signal SEL is coupled to the output of logic 184 to receive signal rs. Accordingly, input A is routed to output O/P of switch 190 when rs is inactive (rs=0) and input B is routed to output O/P of switch 190 when rs is active (rs=1). Output O/P of switch 190 provides the output data bus q[n] previously described in connection with embedded memory 22. It should be appreciated that instead of tri-state output buffers, switch 190 provides for the selection of the proper source for data output on data output bus q[n] during read operations. Write operations may be performed with system 120 in the manner already described for embedded memory 22.

In one alternative embodiment of system 120, primary memory 130 and redundant memory circuit 160 are defined by separate macros. In another alternative arrangement, primary memory 130 and redundant memory circuit 160 are defined by a single macro. In still other embodiments, primary memory 130, redundant memory circuit 160, or both are provided in the form of one or more separate components and may include a tri-state data output configuration either as an alternative or an addition to a data selection switch configuration. In still others, a BIST may be coupled to system 120 to provide for entry of the addresses of the defective locations into CAM 180 as previously described in connection with embedded memory 22.

Figure 5:
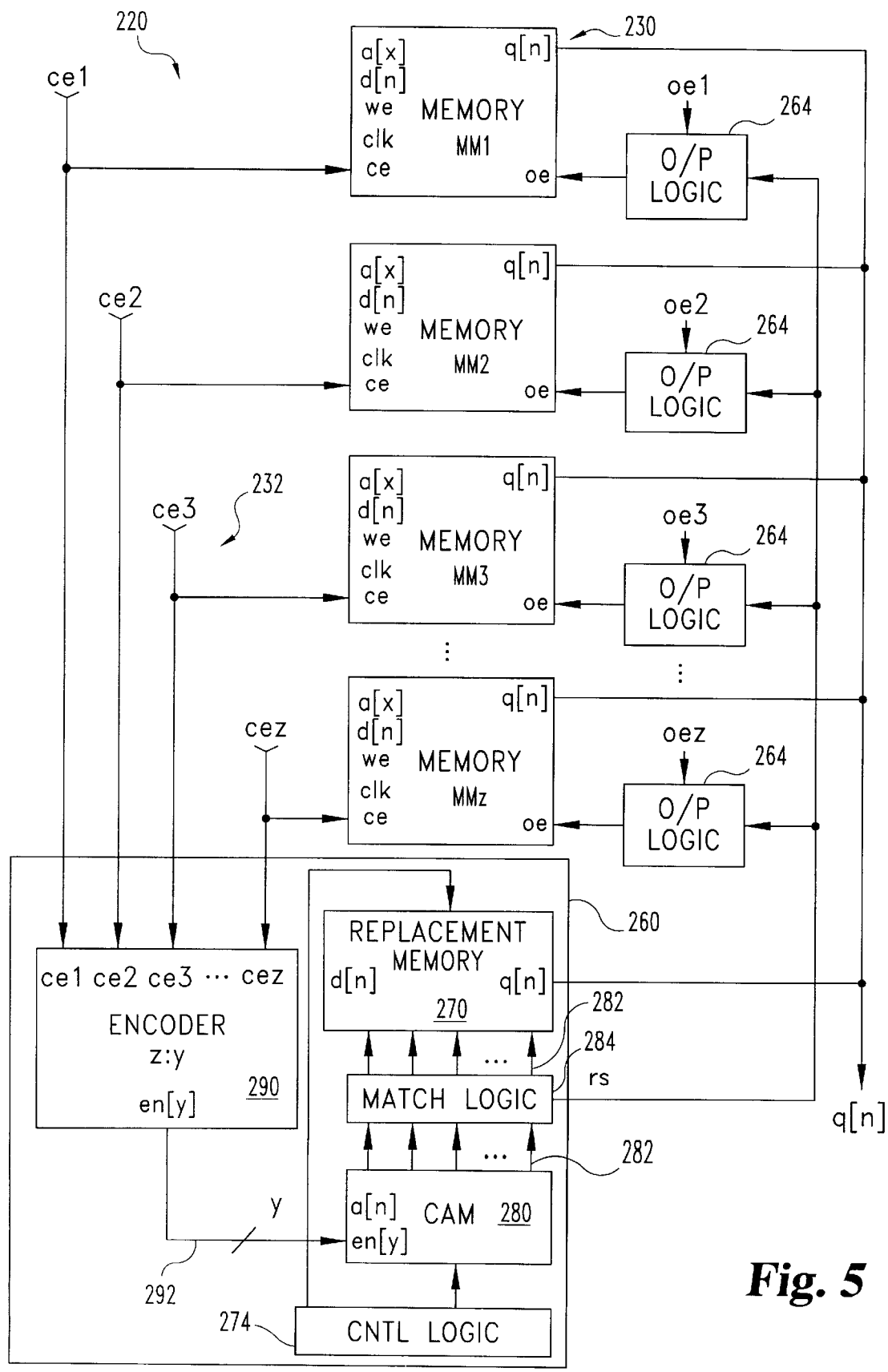
FIG. 5 is a schematic view of a further alternative embodiment of a redundant memory system of the present invention.

FIG. 5 illustrates yet another embodiment of a redundant memory system 220 of the present invention. System 220 includes primary memory 230 with "z" number of memory blocks or modules designated MM1, MM2, M3, . . . , MMz and redundant memory circuit 260. It should be appreciated that primary memory 230 and redundant memory circuit 260 are coupled to a set of common inputs including clk, we, address bus a[x], and data input bus d[n] as previously described in connection with FIGS. 1–4; but are not shown to preserve clarity. However, FIG. 5 does illustrate a set of "z" number of corresponding memory enable inputs 232 individually designated as ce1, ce2, ce3, . . . , cez. Memory enable inputs 232 are provided to primary memory 230 and redundant memory circuit 260 in a one-to-one correspondence to memory modules MM1, MM2, MM3, . . . , MMz. Memory enable inputs 232 each enable a different one of the "z" number of memory modules for primary memory 230 with only one being active at a time under nominal operating conditions. In FIG. 5, the ellipses each represent the optional addition of one or more features like those between which each is situated. Moreover, while four memory modules and corresponding memory enable inputs 232 (z=4) are explicitly shown, more or fewer memory modules and respective enable memory inputs may be utilized as would occur to those skilled in the art.

Redundant memory circuit 260 operates to provide a substitute memory location when a location of primary memory 230 is determined to be defective. Redundant memory circuit 260 includes read/write replacement memory 270, control logic 274, CAM 280, and match logic 284 arranged in a manner as previously described for replacement memory 170, logic 174, CAM 180, and match logic 184, respectively. However, it should be appreciated that CAM 280 does not directly store the status of ce1, ce2, ce3, . . . , cez. Instead, replacement memory circuit 260 includes encoder 290 which encodes the "z" number of enable inputs 232 into "y" number of bits; where y is less than z(y<z). The "y" bits collectively provide enable information that is output to CAM 280 along signal pathway 292. In one example, if eight enable inputs 232 are utilized (z=8), y may be as few as three (y=3). Alternatively, a different number of z enable inputs may be encoded by encoder 290 to provide y number of output bits to CAM 280 in accordance with the expression $z=2^y$ applicable to standard binary encoders. As a result, fewer bits are needed within CAM 280 to store enable information, as compared to an approach having a large number of memory enable inputs 232 without encoder 290. Depending on the internal organization of CAM 280, it may or may not include a decoder (not shown) to partially or completely decode the y bits of encoded enable information.

Redundant memory system 220 includes an output (O/P) logic unit 264 for each of the z number of memory modules of primary memory 230. Redundant memory circuit 260 generates signal rs to control the source of information for output on data bus q[n] in conjunction with output logic units 264. Logic units 264 each receive a corresponding one of z number of output enable signals oe1, oe2, oe3, . . . , oez and may be arranged like output logic 63 of embedded memory 22. As specifically shown in FIG. 5, each logic unit 264 is configured as a two input AND gate with one input being a respective output enable signal (oe1, oe2, oe3, . . . , oez) and the other being an inverted input of signal rs. Notably, this arrangement favors inclusion of a tri-state output buffer structure within each memory module MM1, MM2, MM3, . . . , MMZ and replacement memory 270. Alternatively, a data switch or multiplexer arrangement like that described in connection with system 120 may be utilized to control sourcing for output data bus q[n]. In still other embodiments, a different arrangement as a function of one or more outputs from redundant memory circuit 260, like signal rs, may be utilized as would occur to those skilled in the art.

CAM 280 is arranged to store addresses for defective locations in primary memory 230 along with the y bits of encoded memory enable information provided by encoder 290. If a match entry is detected within CAM 280, a corresponding one of match lines 282 is activated to access a respective replacement location of replacement memory 270 and to set rs (rs=1) with match logic 284. Correspondingly, output logic 264 determines whether primary memory 230 or replacement memory 270 will be a source of information for output data bus q[n] for read operations as a function of signal rs.

In still other embodiments, features of integrated circuit 20, system 120, system 220 may be interchanged, deleted, combined, or substituted. For example, data output control by tri-state buffers of integrated circuit 20 or a multiplexing switch arrangement like that of system 120 may be interchanged or combined. In another example, a built-in self-test may be used in conjunction with system 120 and/or system 220 to provide entries in CAM 180, CAM 280 corresponding to defective locations of the primary memory 130, 230 as described in connection with integrated circuit 20. Furthermore, encoders may be partially or completely utilized in other embodiments to reduce the number of bits needed to store information in a CAM relative to the number of enable inputs for the main/primary memory. Also, while input and output data busses have been separately illustrated, the present invention may be adapted for use with bi-directional data bus arrangements, as well. In yet another alternative, address and data bus signal paths may be partially or completely shared through time multiplexing or other techniques. Moreover, while address and data busses have been described in a multi-bit, parallel form, the present invention may also be applied to address and/or data busses that are partially or completely serial in form.

Further, while primary memory 30, 130, 230 and replacement memory 70, 170, 270 have been described as the read/write, randomly accessible type, other types are also contemplated. For example, any of these memories may be of a read-only memory (ROM) variety that is initially programmed during manufacture; where the replacement memory would naturally be programmed after evaluating the main/primary memory. This variation equally applies to other types of "write-limited" memory such as Ultra Violet Electrically Erasable Read Only Memory (UVEPROM); Electrically Erasable Programmable Read Only Memory (EEPROM); and/or Flash memory just to name a few. In another example, replacement memory is of the read/write type, while one or more primary memory blocks modules are one of these write-limited forms (ROM, UVEPROM, EEPROM, etc.). In still other examples, the present invention is adapted to apply to sequentially accessible memory types, such as memories accessed on a First-In First-Out (FIFO); Last-In, Last-Out (LIFO), or sequential block basis, to name only a few.

As described for CAM 80, one technique utilizes a flag bit 89 to indicate if a given CAM location 88 and corresponding replacement memory location 78 is to be used in lieu of primary memory 30. However, other techniques may be utilized in accordance with the present invention. For example, in one alternative, excess locations in replacement memory and the corresponding CAM that are not needed as substitutes may nonetheless be arranged to correspond to one or more reserve addresses that are not valid for the primary memory. For this arrangement, a flag bit would not be needed in the redundant memory CAM. In still another alternative, excess CAM and replacement memory locations not needed for substitution of defective locations in a primary memory are filled with one or more non-defective locations of the primary memory. For this embodiment, the replacement memory locations are selected in lieu of the corresponding non-defective primary memory locations, if and until they are needed for defective location substitution. Again, this approach does not require a flag bit in the redundant memory CAM. Moreover, these alternatives lend themselves to use in a redundant memory system that dynamically re-determines which locations of the primary memory may be defective by built-in self-testing or otherwise.

Figure 6:
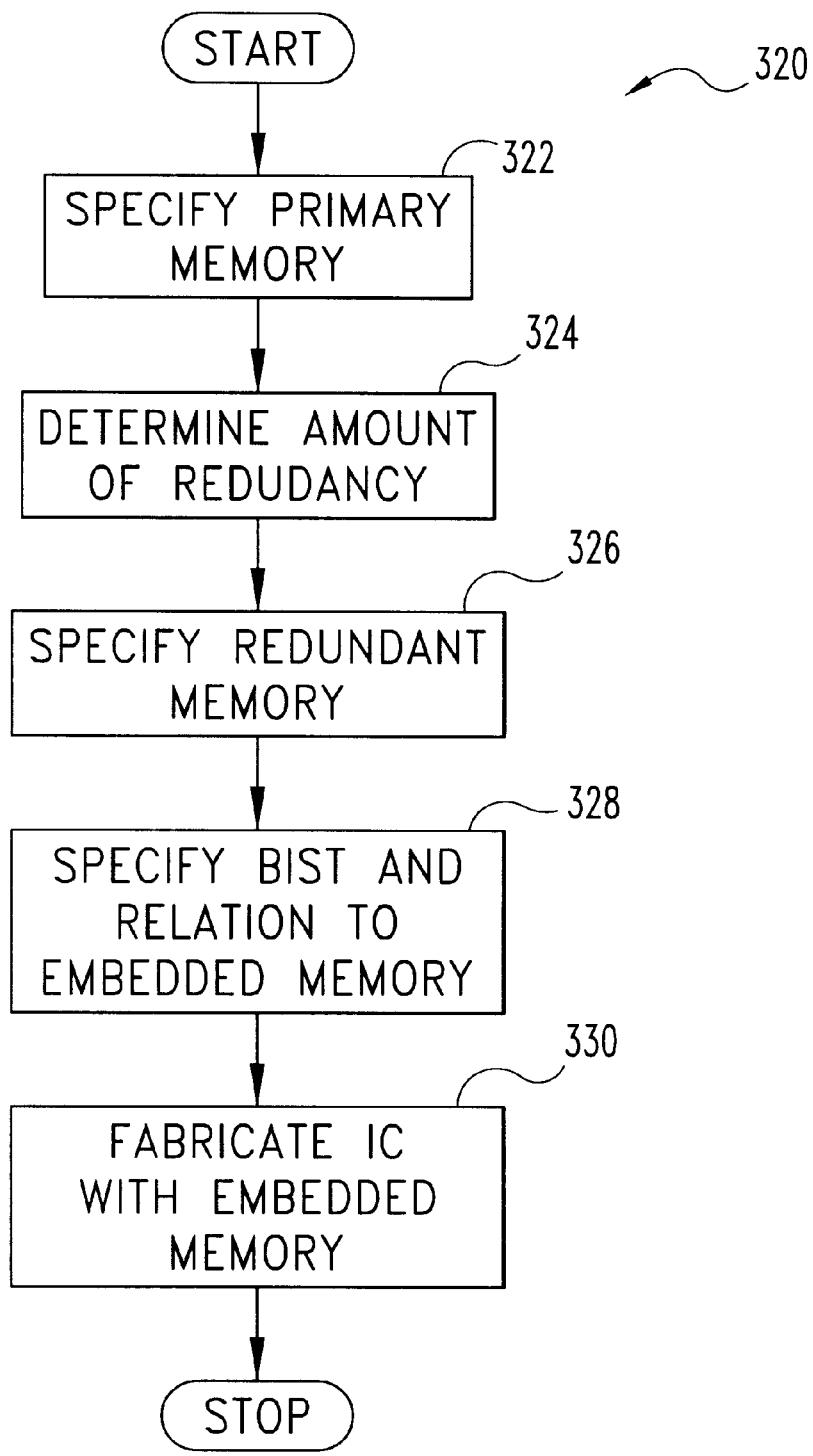
FIG. 6 is a flow chart of one example of a process for designing an embedded memory of an ASIC.

FIG. 6 provides a flow chart of one example of a design process 320 for redundant embedded memory of an ASIC. Process 320 starts in stage 322 with the designation of features for the primary embedded memory such as the number of locations, bit-width, output type, and the like. The primary memory is then specified through one or more appropriate memory macros suitable to define the desired embedded memory. This specification may include determining one or more macro parameters to provide the desired memory features.

In stage 324, the amount of redundant memory is determined. This determination is generally performed as a function of the amount and size of primary memory 30 specified in stage 322, the desired fault tolerance of the embedded memory overall, availability of ASIC resources, ASIC fabrication process maturity, experienced yield for the selected ASIC manufacturing process, and/or other factors as would occur to those skilled in the art. Once a desired amount of redundant memory is determined, a redundant memory macro is specified with appropriate parameters in stage 326 to provide the desired redundant memory. Notably, for large memories, more than one redundant memory macro may be specified in stage 326. Furthermore, stages 322–328 may be repeated in a iterative design procedure to optimize the ASIC design. Such repetitions may adjust/refine macro parameters based on automated layout results, computer simulations, prototype testing, and the like.

The redundant memory macro may be structured to include interface logic such as logic 64, 264; switch 190, encoder 290, and/or other devices as needed. Alternatively, such logic may be provided by one or more separate macros or within the macros utilized to define the primary memory as part of stage 322, stage 326, or as a separate stage (not shown). Also, it should be mD appreciated that in stage 326, the redundancy macro may be specified and parameterized separately from memory macros for stage 322. This separate, independent macro approach facilitates changing the amount of redundancy without needing to redesign the memory macro utilized to define primary memory. Moreover, a complex, embedded memory macro specifying both redundant and primary memory circuitry need not be utilized for design process 320.

In stage 328, built-in self-test parameters are determined and specified in relation to the embedded memory. The BIST may be specified through one or more macros or other HDL instructions as appropriate. In still other embodiments, a BIST may not be specified at all (not shown). In stage 330, the overall ASIC design is generated using one or more HDL design tools and an integrated circuit fabricated using standard ASIC techniques. It should be understood that typically many other stages and operations may be performed as part of the IC design and fabrication process as would occur to those skilled in the art that are not shown here to preserve clarity and avoid obscuring certain aspects of the present invention.

In another embodiment, an apparatus includes an address, a random access memory, a content addressable memory, a replacement memory, and a data bus. The random access memory includes a number of addressable memory locations, each accessed by a different one of a number of addresses provided by the address bus. The content addressable memory stores a number of defective location addresses, each corresponding to a defective addressable memory location of the random access memory. The content addressable memory responds to a match between an address provided by the address bus and one of the defective location addresses to activate a corresponding one of a number of match signal lines. The replacement memory is coupled to the content addressable memory by the match signal lines and includes a number of replacement memory locations each accessed by activating a different one of the match signal lines. During read operations, the data bus receives memory information from the random access memory addressed by one of the addresses other than one of the defective location addresses, and receives replacement information from the replacement memory in response to activation of a respective one of the match signal lines. The defective information in the addressable memory is accessed in response to addressing by a respective one of the defective location addresses but is prevented from being output by activation of the respective match signal line for read operations.

In yet another embodiment, the present invention includes an address bus, a data bus, a random access read/write memory, a replacement circuit, and a data source selection switch. The random access read/write memory includes a number of addressable memory locations each accessed by a different one of a number of addresses provided by the address bus. The replacement circuit includes a content addressable memory and a replacement memory coupled to the content addressable memory. The replacement memory has a number of separately accessible replacement memory locations. The content addressable memory stores a number of defective location addresses each corresponding to a defective one of the addressable memory locations. The content addressable memory responds to a match between an address from the address bus and one of the defective location addresses to prompt access to a corresponding one of the replacement memory locations and generate a replacement signal. The data source selection switch has an output operatively coupled to the data bus, a first input coupled to the random access memory, and a second input coupled to the replacement memory. During read operations, the switch is responsive to the replacement signal to route information from the replacement memory to the data bus and prevent output of defective information contained in the addressable memory from reaching the data bus.

In a further embodiment, an apparatus of the present invention includes an address bus, a data bus, a first read/write memory, and a replacement circuit. The first read/write memory includes a number of first memory locations that each respond to a corresponding one of a number of addresses provided by the address bus. The replacement circuit includes a content addressable memory coupled to a second read/write memory. The second read/write memory includes a number of second memory locations. A content addressable memory stores a set of addresses each corresponding to a different one of the addresses provided by the address bus to access the first memory. The content addressable memory responds to the address bus to determine a match between an address provided by the address bus and one of the set of addresses. The replacement circuit responds to the match to output a corresponding one of the second memory locations on the data bus and prevent information in the first memory accessed by the address from reaching the data bus during read operations.

In still a further embodiment, a method of the present invention includes developing an integrated circuit design including a read/write random access memory with a plurality of addressable locations and specifying one or more memory macros in accordance with the design to provide the random access memory. A desired amount of redundancy for the random access memory is determined in accordance with the selected size of the memory. A redundancy macro is specified in accordance with this determination. The redundancy macro is independently selectable and scalable relative to the memory macros and is arranged to provide a content addressable memory coupled to a read/write replacement memory. This replacement memory has a plurality of replacement memory locations. The content addressable memory stores a number of addresses corresponding to defective memory locations in the memory and prompts replacement by a corresponding number of the replacement memory locations. A built-in self-test is specified in the design to test the memory to determine the addresses corresponding to the defective memory locations for storage in the content addressable memory. An integrated circuit device is fabricated in accordance with the design.

In yet a further embodiment, another method of the present invention includes: (a) providing a primary memory including a number of primary memory locations and a replacement memory including a number of replacement memory locations, the primary memory and the replacement memory each being coupled to a data bus; (b) identifying a defective one of the primary memory locations; (c) outputting replacement information on the data bus from one of the replacement memory locations corresponding to the defective one of the primary memory locations during a read operation; (d) accessing the defective one of the primary memory locations during the read operation; and (e) preventing output of defective information from the defective one of the primary memory locations during the read operation. Optionally, this embodiment may include receiving an address for the primary memory in a content addressable memory coupled to the replacement memory by a number of match signal lines. As a further option, identification of one or more defective primary memory locations is performed using BIST and corresponding information is stored in the content addressable memory to cause one or more of the replacement memory locations to be used instead.

All publications, patents, and patent applications cited in this specification are herein incorporated by reference as if each individual publication, patent, or patent application was specifically and individually indicated to be incorporated by reference and set forth in its entirety herein. While the invention has been illustrated and described in detail in the drawings and foregoing description, the same is considered to be illustrative and not restrictive in character, it is understood that only the preferred embodiments have been shown and described and that all changes, modifications and equivalents that come within the spirit of the invention as defined by the following claims are desired to be protected.

What is claimed is:

1. An apparatus, comprising:
    an address bus;
    a random access memory including a number of addressable memory locations each accessed by a different one of a number of addresses provided by the address bus, wherein the random access memory has a tristate output coupled to the data bus and the tristate output is disabled when any one of the match signal lines is activated;
    a content addressable memory operable to store a number of defective location addresses each corresponding to a defective addressable memory location of the random access memory, the content addressable memory being responsive to a match between an address provided by the address bus and one of the defective location addresses to activate a corresponding one of a number of match signal lines;
    a replacement memory coupled to the content addressable memory by the match signal lines, the replacement memory including a number of replacement memory locations each accessed by activating a different one of the match signal lines; and a data bus coupled to the random access memory and the replacement memory, the random access memory being operable to output memory information on the data bus when addressed by one of the addresses other than one of the defective location addresses for a first read operation, the replacement memory being operable to output replacement information in the data bus in response to activation of a respective one of the match signal lines for a second read operation, defective information in the random access memory being accessed in response to the second read operation and output of the defective information on the data bus being prevented in response to the activation of the respective one of the match signal lines.

2. The apparatus of claim 1, wherein the content addressable memory includes a set of address storage locations, the defective location addresses occupying a first portion of the address storage locations, and the content addressable memory is further operable to store a number of reserve addresses in a second portion of the address storage locations.

3. The apparatus of claim 1, further comprising a data source selection switch including an output coupled to the data bus, a first input coupled to the random access memory, and a second input coupled to the replacement memory, the data source selection switch routing the second input to the output when any one of the match signal lines is activated.

4. The apparatus of claim 1, further comprising a logic device coupled between the match signal lines and the random access memory to provide a replacement signal.

5. The apparatus of claim 1, wherein the random access memory is provided in the form of a number of different memory blocks each defined by a common memory macro, the content addressable memory and the replacement memory are defined by a redundancy macro, and the random access memory, the content addressable memory, and the replacement memory are formed on a common integrated circuit chip.

6. The apparatus of claim 1, further comprising a built-in test circuit operatively coupled to the random access memory and the content addressable memory the built-in test circuit being operable to test the addressable memory locations of the random access memory to determine the defective location addresses and store the defective location address in the content addressable memory.

7. The apparatus of claim 6, wherein the random access memory is defined by a plurality of memory blocks, the memory blocks each including one of a corresponding number of tristate outputs, and further comprising:
a plurality of logic devices each coupled to a corresponding one of the tristate outputs, each of the plurality of logic devices having a first input for a dedicated memory output enable signal and a second input;
another logic device generating a replacement status bit when any of the match signal lines is active, the replacement status bit being provided to the second input of each of the plurality of logic devices to disable the tristate outputs of the memory blocks.

8. An apparatus, comprising:
an address bus;
a data bus;
a random access read/write memory including a number of addressable memory locations each accessed by a different one of a number of addresses provided by the address bus;
a replacement circuit including a content addressable memory and a replacement memory coupled to the content addressable memory, the replacement memory having a number of separately accessible replacement memory locations, the content addressable memory being operable to store a number of defective location addresses each corresponding to a defective one of the addressable memory locations, the content addressable memory being responsive to a match between an address from the address bus and one of the defective location addresses to prompt access to a corresponding one of the replacement memory locations and generate a replacement signal;
a data source selection switch having an output operatively coupled to the data bus, a first input coupled to the random access memory and a second input coupled to the replacement memory, the switch being responsive to the replacement signal during a read operation to route information from the replacement memory to the data bus and prevent output of defective information contained in the addressable memory from reaching the data bus; and
a number of match signal lines couple the content addressable memory to the replacement memory, the replacement circuit includes a logic device receiving each of the match signal lines as an input, and the logic device generates the replacement signal in response to activation of any of the match signal lines.

9. The apparatus of claim 8, wherein the data source selection switch is configured to multiplex between the random access memory and the replacement memory in response to the replacement signal.

10. The apparatus of claim 8, further comprising a built-in test circuit operatively coupled to the random access memory and the content addressable memory, the built-in test circuit being operable to test the addressable memory locations of the random access memory to determine the defective location addresses and store the defective location addresses in the content addressable memory.

11. The apparatus of claim 10, wherein the random access memory is provided in the form of a number of different memory blocks each defined by a common memory macro, the content addressable memory and the replacement memory are defined by a redundancy macro, the redundancy macro being independent of the common memory macro, and the random access memory, the content addressable memory, and the replacement memory are formed on a common integrated circuit chip.

12. The apparatus of claim 8, wherein the content addressable memory includes a set of address storage locations, the defective location addresses occupying a first portion of the address storage locations, and the content addressable memory is further operable to store a number of reserve addresses in a second portion of the address storage locations.

13. An apparatus, comprising:
an address bus;
a data bus;
a first read/write memory including a number of first memory locations each being responsive to a corresponding one of a number of addresses provided by the address bus; and
a replacement circuit including a content addressable memory and a second read/write memory operatively coupled to the content addressable memory, the second read/write memory including a number of second memory locations, the content addressable memory being operable to store a set of addresses each corresponding to a different one of the addresses provided by the address bus to access the first memory, the content addressable memory being responsive to the address bus to determine a match between an address provided by the address bus and one of the set of addresses, the replacement circuit being responsive to the match to output a corresponding one of the second memory locations on the data bus during a read operation and prevent information in the first memory accessed by the address from reaching the data bus.

14. The apparatus of claim 13, wherein a first portion of the first memory locations are defective and at least a portion of the second memory locations correspondingly replace the first memory locations.

15. The apparatus of claim 13, wherein the replacement circuit includes a number of match signal lines coupling the content addressable memory to the second memory, the second locations of the second memory each being accessed by activation of a different one of the match signal lines.

16. The apparatus of claim 13, wherein the first memory includes a tristate output, the output being disabled in response to the match.

17. The apparatus of claim 13, further including a data source selection switch responsive to the match.

18. The apparatus of claim 13, wherein the content addressable memory includes a plurality of address storage locations, the set of addresses each corresponding to a different one of a number of defective first memory locations and occupying a first portion of the address storage locations, and the content addressable memory is further operable to store a number of reserve addresses in a second portion of the address storage locations.

19. The apparatus of claim 18, wherein the reserve addresses each correspond to a nondefective one of the first memory locations, the replacement circuit being operable to provide information from the second memory for each of the reserve addresses instead of the first memory.

20. The apparatus of claim 19, further comprising a built-in test circuit operable to test the first memory and determine the set of addresses, the built-in test circuit being further operable to test the second memory to select a set of the second locations that are nondefective for operation with the replacement circuit.

21. The apparatus of claim 13, wherein the random access memory is provided in the form of a number of different memory blocks each defined by a common memory macro, the content addressable memory and the replacement memory are defined by a redundancy macro, the redundancy macro being independent of the common memory macro, and the random access memory, the content addressable memory, and the replacement memory are formed on a common integrated circuit chip.

22. A method, comprising:
developing an integrated circuit design including a read/write random access memory with a plurality of addressable locations;
specifying one or more memory macros in accordance with the design to provide the random access memory;
determining a desired amount of redundancy for the random access memory in accordance with selected size of the memory;
specifying a redundancy macro in accordance with said determining, the redundancy macro being independently selectable and scaleable relative to the memory macros, the redundancy macro being arranged to provide a content addressable memory and a read/write replacement memory coupled to the content addressable memory, the replacement memory having a plurality of replacement memory locations, the content addressable memory being operable to store a number of addresses corresponding to defective memory locations in the memory and prompt replacement by a corresponding number of the replacement memory locations;
specifying a built-in self test in the design, the built-in self test being operable to test the memory to determine the addresses corresponding to the defective memory locations for storage in the content addressable memory; and
fabricating an integrated circuit device in accordance with the design.

23. The method of claim 22, wherein a plurality of memory macros are specified each corresponding to a different one of a number of memory blocks, the memory blocks defining the random access memory.

24. The method of claim 22, wherein the desired amount of memory redundancy is further determined in accordance with the maturity of a fabrication process utilized for the integrated circuit device.

25. The method of claim 22, wherein the replacement memory is coupled to the content addressable memory by a number of match signal lines, the replacement memory locations of the replacement memory each being accessed by activating a different one of the match signal lines.

26. The method of claim 25, wherein the random access memory includes at least one tristate output, the output being disabled in response to activation of any of the match signal lines.

27. The method of claim 25, further comprising specifying a data source selection circuit, the data source selection circuit including an output coupled to a data bus, a first input coupled to the random access memory and a second input coupled to the replacement memory, the data source selection circuit routing the second input to the output in response to activation of any of the match signal lines.

28. The method of claim 22, wherein the built-in self test circuit is further operable to test the replacement memory to disable any defective replacement memory locations in the replacement memory.

\* \* \* \* \*